United States Patent
Son et al.

(10) Patent No.: US 8,752,285 B2
(45) Date of Patent: Jun. 17, 2014

(54) METHOD FOR MANUFACTURING A TEXTILE-TYPE ELECTRONIC COMPONENT PACKAGE

(75) Inventors: Yong Ki Son, Daejeon (KR); Baesun Kim, Daejeon (KR); Ji Eun Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 467 days.

(21) Appl. No.: 13/049,431

(22) Filed: Mar. 16, 2011

(65) Prior Publication Data

US 2011/0226515 A1 Sep. 22, 2011

(30) Foreign Application Priority Data

Mar. 16, 2010 (KR) .................. 10-2010-0023301
Jul. 6, 2010 (KR) .................. 10-2010-0064961

(51) Int. Cl.
*H01K 3/10* (2006.01)

(52) U.S. Cl.
USPC .............. 29/852; 29/831; 29/846; 174/262; 361/767

(58) Field of Classification Search
USPC ............ 29/830, 831, 846, 852; 174/260–262, 174/264; 257/698, 783; 361/760, 767, 779, 361/792
See application file for complete search history.

(56) References Cited

U.S. PATENT DOCUMENTS

| | | | |
|---|---|---|---|
| 5,870,289 A * | 2/1999 | Tokuda et al. | 361/779 |
| 5,920,123 A * | 7/1999 | Moden | 29/832 |
| 6,729,025 B2 | 5/2004 | Farrell et al. | |
| 7,025,596 B2 | 4/2006 | Zollo et al. | |
| 7,638,885 B2 | 12/2009 | Yoo et al. | |
| 2004/0231141 A1* | 11/2004 | Nishinaka et al. | 29/846 |

FOREIGN PATENT DOCUMENTS

| | | |
|---|---|---|
| JP | 2-129938 | 5/1990 |
| KR | 10-0894624 | 10/2008 |
| WO | 01/30123 A1 | 4/2001 |

OTHER PUBLICATIONS

Buechley, Leah et al., "Fabric PCBs, electronic sequins, and socket buttons: techniques for e-textile craft," Pers. Ubiquit. Comput., vol. 13:133-150 (2009).
Kim, Hyejung et al., "A Wearable Fabric Computer by Planar-Fashionable Circuit Board Technique," Sixth International Workshop on Wearable and Implantable Body Sensor Networks, pp. 282-285 (2009).
Linz, Torsten et al., "Embroidering Electrical Interconnects with Conductive Yarn for the Integration of Flexible Electronic Modules into Fabric," Proceedings of the Ninth IEEE International Symposium on Wearable Computers (ISWC'05), pp. 86-89 (2005).

* cited by examiner

*Primary Examiner* — Donghai D Nguyen
(74) *Attorney, Agent, or Firm* — Nelson Mullins Riley & Scarborough LLP; Anthony A. Laurentano, Esq.

(57) ABSTRACT

A textile-type electronic component package includes a textile base; a textile-type electronic component and a plurality of conductive patterns having end contact points formed on the top surface of the textile base; a thermoplastic adhesive formed on the bottom surface of the textile base; a plurality of mounting pads formed on the thermoplastic adhesive and facing the conductive patterns, respectively; and a plurality of via-hole-type coupling parts penetrating end contact points of the conductive patterns, the textile base, and the thermoplastic adhesive, and electrically coupling the mounting pads and the conductive patterns, wherein the via-hole-type coupling parts includes a bunch of via-holes filled with a conductive polymer.

4 Claims, 10 Drawing Sheets

METHOD FOR MANUFACTURING A TEXTILE-TYPE ELECTRONIC COMPONENT PACKAGE

CROSS-REFERENCE(S) TO RELATED APPLICATION(S)

The present invention claims priority of Korean Patent Application No. 10-2010-0023301, filed on Mar. 16, 2010 and Korean Patent Application No. 10-2010-0064961, filed on Jul. 6, 2010, which are incorporated herein by reference.

FIELD OF THE INVENTION

The present invention relates to a structure of a textile-type electronic component package, and more particularly, to a textile-type electronic component package specialized to be suitable for implementing a computing system on a textile or clothes, a method for manufacturing the same, and a method for mounting the textile-type electronic component package.

BACKGROUND OF THE INVENTION

With the recent advance of computing technologies, the performance and function of portable devices have been rapidly developed. Since the ubiquitous computing concept has been established, great efforts are in progress to use computing environments anytime anywhere and thus the importance of personal portable devices individuals carry is increasing.

Attempts have been made to apply the ubiquitous computing concept adapted to digital appliances, such as a mobile phone or a smart phone, to daily necessaries, such as clothes, a watch, and a necklace, which have been used in everyday life, rather than for individuals to carry them.

In particular, as a part of these various attempts, studies have been conducted to manufacture the existing rigid electronic components or elements in a form suitable for the textile or clothes and mount them on the textile or clothes. However, such a technology is in its early stage. Electronic circuits made on textiles must not cause an uncomfortable feeling in activity and must overcome several poor conditions, such as bending or stretching in activity, which have not been considered in the existing electronic devices.

Such existing methods are to couple and attach a flexible printed circuit board or a textile circuit board to a circuit formed on a textile or clothes, by sewing them using a sewing machine and then stitching them with a conductive coating yarn, a conductive fiber yarn or a conductive filament yarn. However, due to the nature of the sewing machine, it is difficult to implement elaborate patterns and it is also difficult to achieve the mechanization for mass production. In particular, in the case of using the conductive filament yarn, there is a technical difficulty in removing a filament sheath.

SUMMARY OF THE INVENTION

In view of the above, the present invention provides a method for manufacturing a textile-type electronic component package, and a method for easily coupling the manufactured package to a circuit made on a textile.

Further, the present invention provides a mounting method which is capable of manufacturing a textile-type electronic component package and easily mounting the manufactured textile-type electronic component package on a textile, thereby constructing an electronic circuit on the textile.

In accordance with a first aspect of the present invention, there is provided a textile-type electronic component package, which includes: a textile base; a textile-type electronic component and a plurality of conductive patterns having end contact points formed on the top surface of the textile base; a thermoplastic adhesive formed on the bottom surface of the textile base; a plurality of mounting pads formed on the thermoplastic adhesive and facing the conductive patterns, respectively; and a plurality of via-hole-type coupling parts penetrating the end contact points of the conductive patterns, the textile base, and the thermoplastic adhesive, and electrically coupling the mounting pads and the conductive patterns.

In accordance with a second aspect of the present invention, there is provided a method for manufacturing a textile-type electronic component package, which includes: coating a thermoplastic adhesive on the bottom surface of a textile base; forming a textile-type electronic component and a plurality of conductive patterns having end contact points on the top surface of the textile base; forming a plurality of mounting pads on the thermoplastic adhesive facing the end contact points of the conductive patterns; sequentially drilling portions of the end contact points, the textile base, and the thermoplastic adhesive to form a plurality of via-holes partially exposing the top surfaces of the mounting pads; and filling the plurality of via-holes with a conductive polymer to form a plurality of via-hole-type coupling parts to electrically couple the mounting pads and the conductive patterns.

In accordance with a third aspect of the present invention, there is provided a method for mounting a textile-type electronic component package, which includes: preparing a textile-type electronic component package in which a textile-type electronic component and a plurality of conductive patterns having end contact points are formed on the top surface of a textile base, a thermoplastic adhesive and a plurality of mounting pads made of a conductive polymer are formed on the bottom surface of the textile base, and a plurality of via-hole-type coupling parts are formed to electrically couple the mounting pads which face the end contact points of the conductive patterns; aligning the textile-type electronic component package at a target position of a textile having conductive circuit patterns; and applying heat to a region where the textile-type electronic component package and the conductive circuit patterns are contacted together to sinter the conductive polymer and attach the textile-type electronic component package to the textile.

In accordance with a fourth aspect of the present invention, there is provided a textile-type electronic component package, which includes: a textile base; a textile-type electronic component and a plurality of conductive patterns having end contact points formed on the top surface of the textile base; a thermoplastic adhesive formed on the bottom surface of the textile base; and a plurality of via-hole-type coupling parts penetrating the end contact points of the conductive patterns, the textile base, and the thermoplastic adhesive to electrically couple to the conductive patterns.

In accordance with a fifth aspect of the present invention, there is provided a method for manufacturing and mounting a textile-type electronic component package, which includes: coating a thermoplastic adhesive on the bottom surface of a textile base; forming a textile-type electronic component and a plurality of conductive patterns having end contact points on the top surface of the textile base; sequentially drilling portions of the end contact points, the textile base, and the thermoplastic adhesive to form a plurality of via-holes; aligning the textile base, in which the plurality of via-holes are formed, at a target position of a textile having conductive circuit patterns; filling the plurality of via-holes with a conductive polymer; and applying heat to a region where the textile base and the conductive circuit patterns are contacted together to sinter the conductive polymer and attach the textile base to the textile.

BRIEF DESCRIPTION OF THE DRAWINGS

The above and other objects and features of the present invention will become apparent from the following description of embodiments given in conjunction with the accompanying drawings, in which:

FIGS. 1A and 1B show a structure of a textile-type electronic component package in accordance with an embodiment of the present invention, wherein FIG. 1B is a rear view of FIG. 1A;

DETAILED DESCRIPTION OF THE EMBODIMENTS

Hereinafter, embodiments of the present invention will be described in detail with reference to the accompanying drawings so that they can be readily implemented by those skilled in the art.

First Embodiment

Figure 1A:
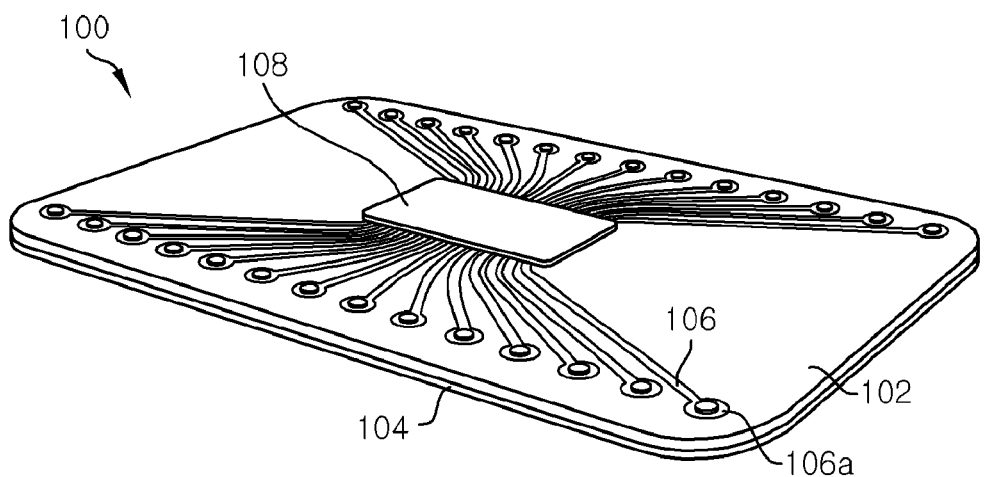
Figure 1B:
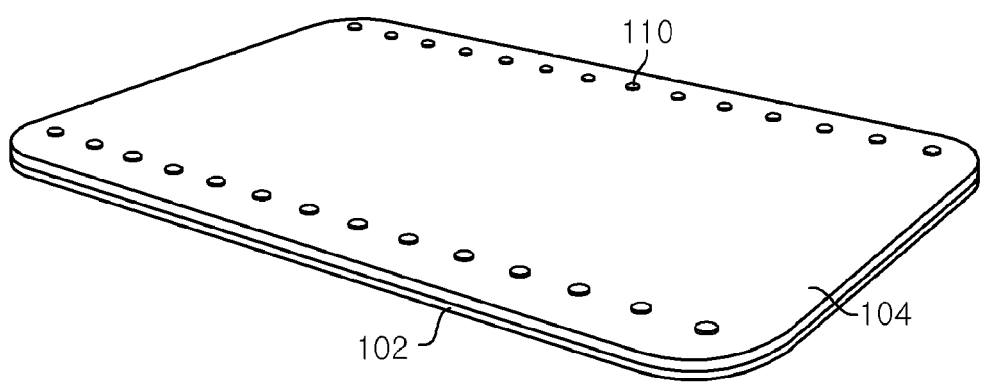

FIGS. 1A and 1B show a structure of a textile-type electronic component package in accordance with an embodiment of the present invention. Referring to FIG. 1A, the textile-type electronic component package 100 in accordance with the embodiment of the present invention has a structure in which a textile-type electronic component 108 and a plurality of conductive patterns 106 electrically connected with the textile-type electronic component 108, each having an end contact point 106a are formed on the top surface of a textile base 102, and a thermoplastic adhesive 104 is formed on the bottom surface of the textile base 102 to be attached to a textile or clothes. The textile-type electronic component package 100 has enough flexibility to mount or attach on the textile or clothes. The textile base 102 may include subsidiary materials for clothes, for example, a textile, a transfer paper, or a seam sealing tape.

The textile-type electronic component 108 and the conductive patterns 106 may be mounted on the textile base 102 by a typical method well known to those skilled in the art. A thermoplastic adhesive used in a hot melt or a hot fix, which is a subsidiary material for clothes, may be used as the thermoplastic adhesive 104. In addition, a transfer paper coated with a thermoplastic adhesive may be used as the textile base 102.

Furthermore, the electronic component 108 mounted on the top surface of the textile base 102 may be a passive device, an active device, or a highly integrated IC. To accommodate the electronic component, the conductive patterns 106 may be formed as many as the number of electrodes of electronic elements mounted on the electronic component 108.

As shown in FIG. 1B which is a rear view of FIG. 1A, a plurality of mounting pads 110 made of a flexible conductive polymer, for example, a conductive ink or a conductive adhesive are formed on the thermoplastic adhesive 104. The plurality of mounting pads 110 are respectively formed at positions facing the end contact points 106a of the conductive patterns 106 formed on the top surface of the textile base 102 along both the longitudinal peripherals of the textile base 102. The mounting pads 110 may be formed by a silk screen printing method using a screen mask. Further, a plurality of via-hole-type coupling parts 112 of a conductive polymer are formed between the end contact points 106a of the conductive patterns 106 and the mounting pads 110, which will be disclosed with reference to FIG. 2.

Figure 2:
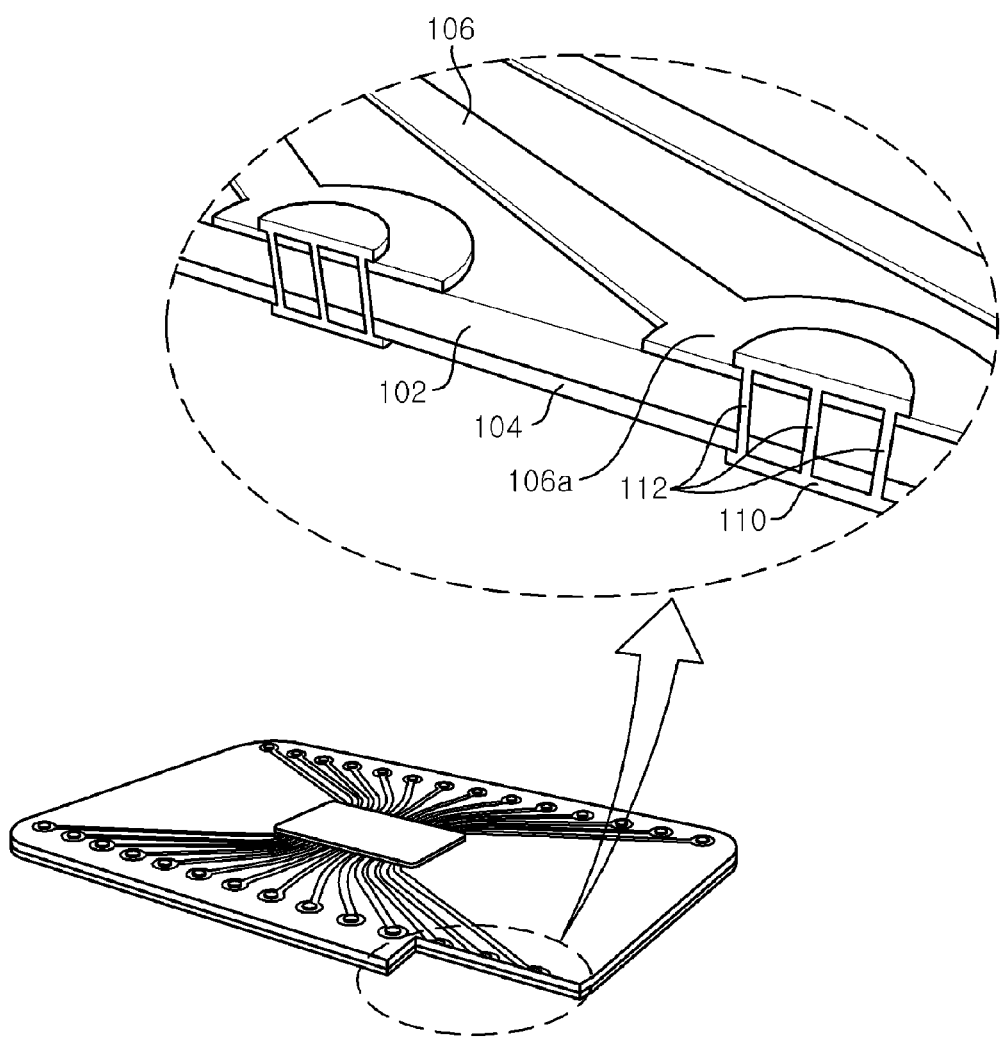
FIG. 2 is an enlarged sectional view showing a detailed structure of via-hole-type coupling grooves of the textile-type electronic component package in accordance the embodiment of the present invention.

FIG. 2 is an enlarged sectional view showing a detailed structure of the via-hole-type coupling parts of the textile-type electronic component package in accordance the embodiment of the present invention.

As shown in FIG. 2, the via-hole-type coupling parts 112 penetrate the textile base 102 and the thermoplastic adhesive 104 to electrically couple the mounting pads 110 and the conductive patterns 106. The via-hole-type coupling parts 112 are formed by sequentially drilling the end contact points 106a of the conductive patterns 106, the textile base 102, and the thermoplastic adhesive 104 to thereby define via-holes and then filling the via-holes with a conductive polymer.

The respective via-hole-type coupling parts 112 may be provided with not a single via-hole but a plurality of via-holes, i.e., a bunch of fine holes, in order to sufficiently maintain rigidity in spite of the physical structural variations such as stretching and bending which may occur during the use of the textile-type electronic component package 100. In this regard, the via-holes constituting the bunch of the fine holes may be formed as many as possible within the range which does not cause difficulty in their manufacture. The fine holes in the bunch may be formed using a fine laser drill.

Figure 3A:
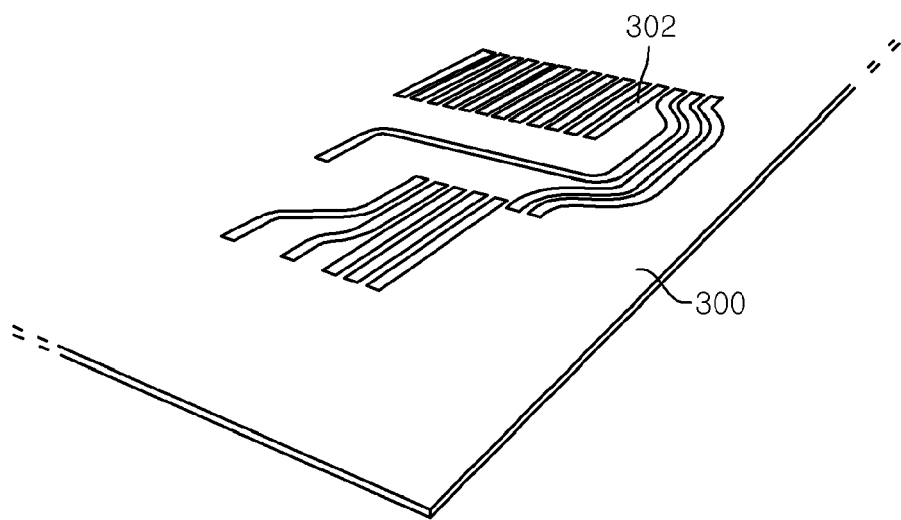
FIGS. 3A and 3B show an exemplary structure in which the textile-type electronic component package in accordance with the embodiment of the present invention is attached to a textile.
Figure 3B:
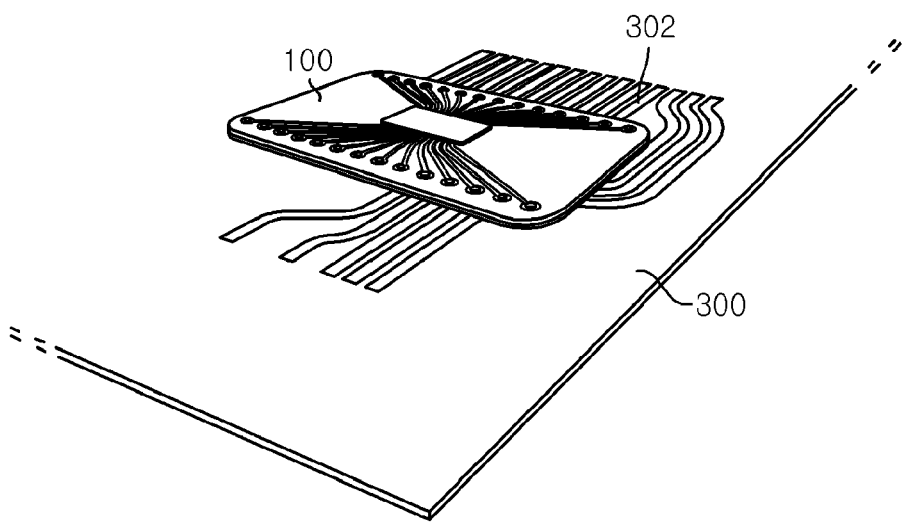

FIGS. 3A and 3B show an exemplary structure in which the textile-type electronic component package shown in FIG. 1A is attached to the textile. Specifically, FIG. 3A shows an exemplary structure in which conductive patterns 302 are formed on a textile 300. The conductive circuit patterns 302 may be formed by a method well known to those skilled in the art. For example, the conductive patterns 302 may be formed by a printing method using a conductive ink, or may be formed by needlework or sewing using a conductive coating yarn or a conductive filament yarn.

FIG. 3B shows an exemplary structure in which the textile-type electronic component package manufactured in accordance with the embodiment of the present invention is attached to the textile 300 where the conductive circuit patterns 302 are formed.

FIGS. 4A to 4G show a procedure of manufacturing a textile-type electronic component package and attaching the manufactured textile-type electronic component package to a textile in accordance with the embodiment of the present invention.

For convenience of explanation and thorough understanding, the following description will be focused on the processes of manufacturing the end contact points 106a, the via-hole-type coupling parts 112, and the mounting pads 110, with reference to FIGS. 4A to 4E.

Figure 4A:
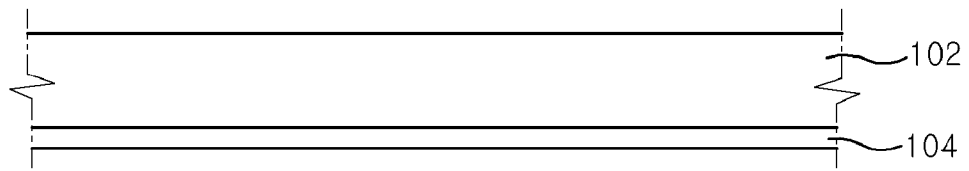
FIGS. 4A to 4G show a procedure of manufacturing a textile-type electronic component package and attaching the manufactured textile-type electronic component package to a textile, in accordance with an embodiment of the present invention.

As illustrated in FIG. 4A, an adhesive coating process is performed to coat a thermoplastic adhesive 104 on the bottom surface of a textile base 102. A thermoplastic adhesive used in a hot melt or a hot fix may be used as the thermoplastic adhesive 104. In addition, a transfer paper coated with a thermoplastic adhesive may be used as the textile base 102.

Figure 4B:
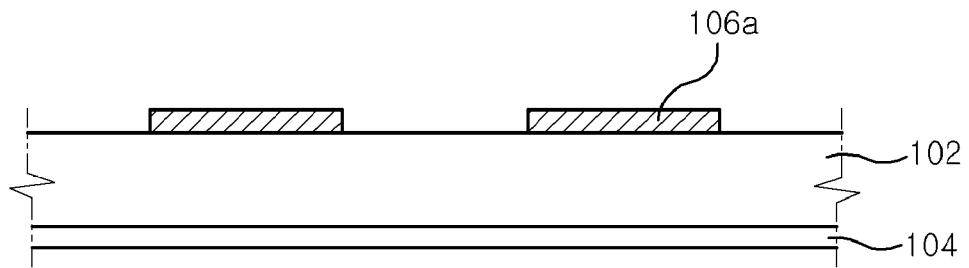

As illustrated in FIG. 4B, a typical method, for example, a silk screen printing method using a screen mask which is well known to those skilled in the art, is performed to form conductive patterns 106 each having an end contact point 106a on the top surface of the textile base 102.

Figure 4C:
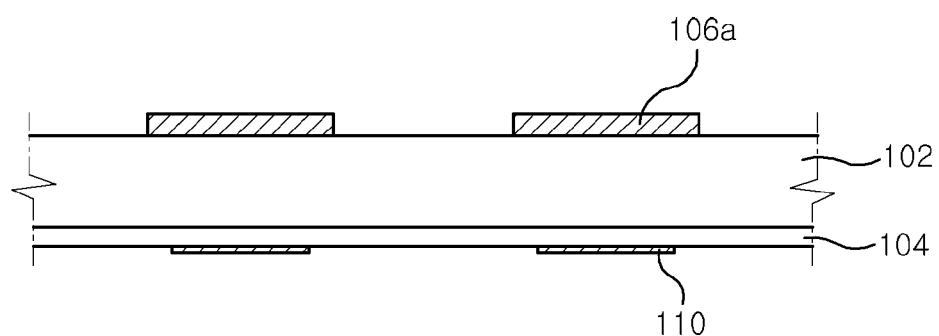

Next, as illustrated in FIG. 4C, a silk screen printing method using a screen mask is performed to form mounting pads 110 using a flexible conductive polymer such as a conductive ink or a conductive adhesive on the bottom surface of the textile base 102.

Figure 4D:
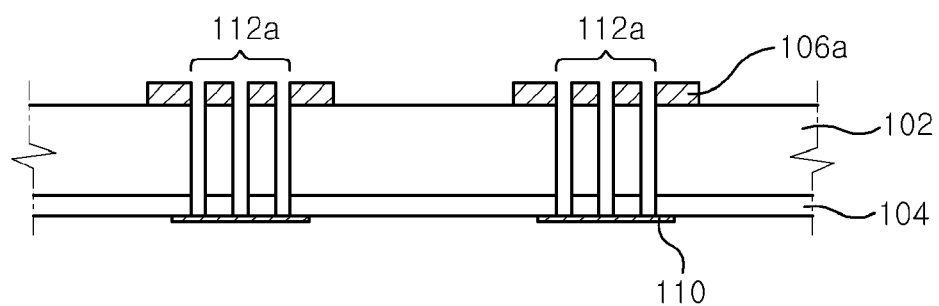

Subsequently, as illustrated in FIG. 4D, a drilling process using a fine laser drill is performed to sequentially drill the end contact points 106a of the conductive patterns 106, the textile base 102, and the thermoplastic adhesive 104 to thereby define via-holes 112a partially exposing the top surfaces of the mounting pads 110. The via-holes 112a may be defined with not a single via-hole but a plurality of via-holes or a bunch of fine holes in order to sufficiently maintain rigidity in spite of the physical structural variations such as stretching and bending which may occur during the use of the textile-type electronic component package.

Figure 4E:
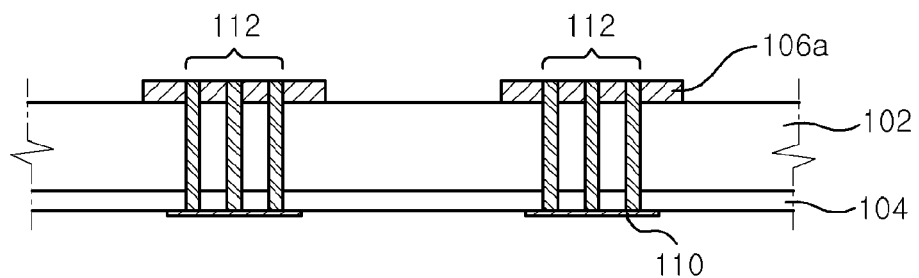

Thereafter, as illustrated in FIG. 4E, a silk screen printing process using a screen mask is performed to fill the fine holes with a conductive polymer to thereby form via-hole-type coupling parts 112 that electrically couple the mounting pads 110 and the conductive patterns 106 through the end contact points 106a. A textile-type electronic component or an electronic component is mounted at a target position on the conductive patterns 106, thereby completing a textile-type electronic component package.

Figure 4F:
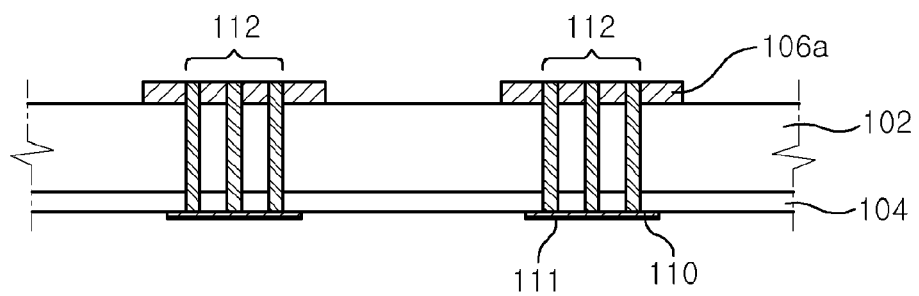

In subsequence, as illustrated in FIG. 4F, a coating process is performed to coat a conductive adhesive or an anisotropic conductive film (AFC) 111 on the mounting pads 110 of the completed textile-type electronic component package.

Figure 4G:
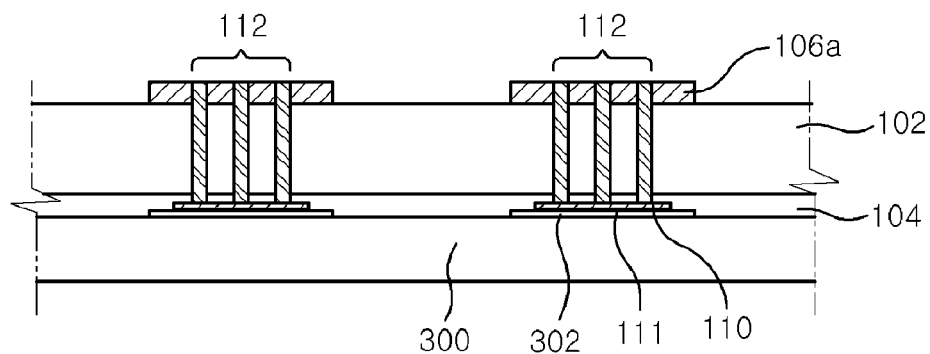

The completed textile-type electronic component package is aligned at the target position of the textile or clothes 300 having conductive circuit patterns 302. That is, the conductive adhesive 111 of the textile-type electronic component package is contacted and aligned on the corresponding conductive circuit patterns 302 formed on the textile 300. For example, as illustrated in FIG. 4G, using a thermocompressor (for example, a laser welding device, an iron, a soldering iron, or an ultrasonic welding device), heat is applied to the region where the textile-type electronic component package and the conductive circuit patterns 302 on the textile 300 are contacted with each other. Consequently, the conductive adhesive 111 is sintered and simultaneously the textile-type electronic component package is attached to the textile 300. The conductive adhesive 111 is a conductive ink or a conductive adhesive which exhibits conductivity only when it is sintered by a predetermined amount of heat. Heat is radiated in a direction toward the rear surface of the textile 300 or the surface on which the textile-type electronic component package is mounted.

As described above, in accordance with the embodiment of the present invention, the mounting pads of the textile-type electronic component package and the conductive circuit patterns of the textile are mutually coupled together and simultaneously the thermoplastic adhesive of the textile-type electronic component package and the textile are attached together at a time through the sintering process using the thermocompressor. Therefore, a relatively weak adhesive strength of the conductive adhesive is strongly complemented by the thermoplastic adhesive disposed therearound, thereby increasing an overall adhesive strength. Hence, even though the textile is deformed by stretching or bending, the excellent rigidity and textile adhesive strength as well as the flexibility can be maintained.

Second Embodiment

Figure 5:
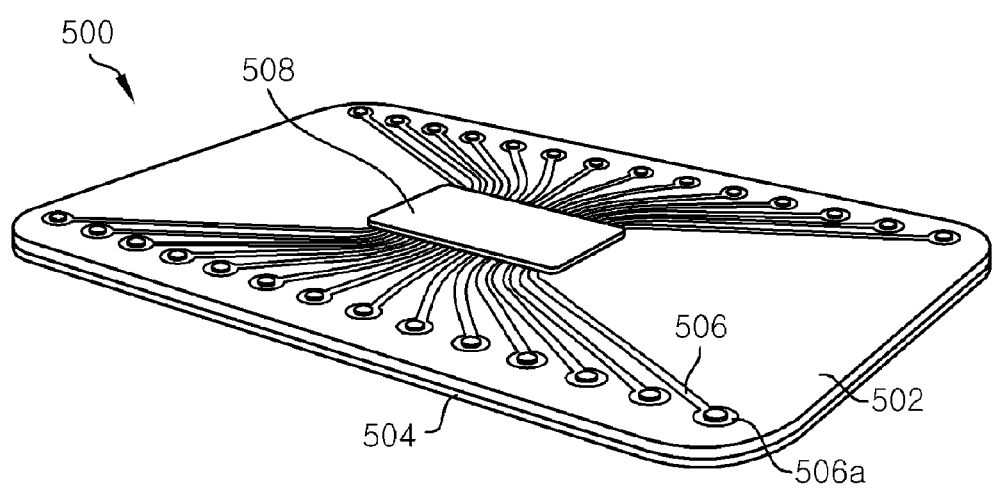
FIG. 5 shows a structure of a textile-type electronic component package in accordance with another embodiment of the present invention.
Figure 6:
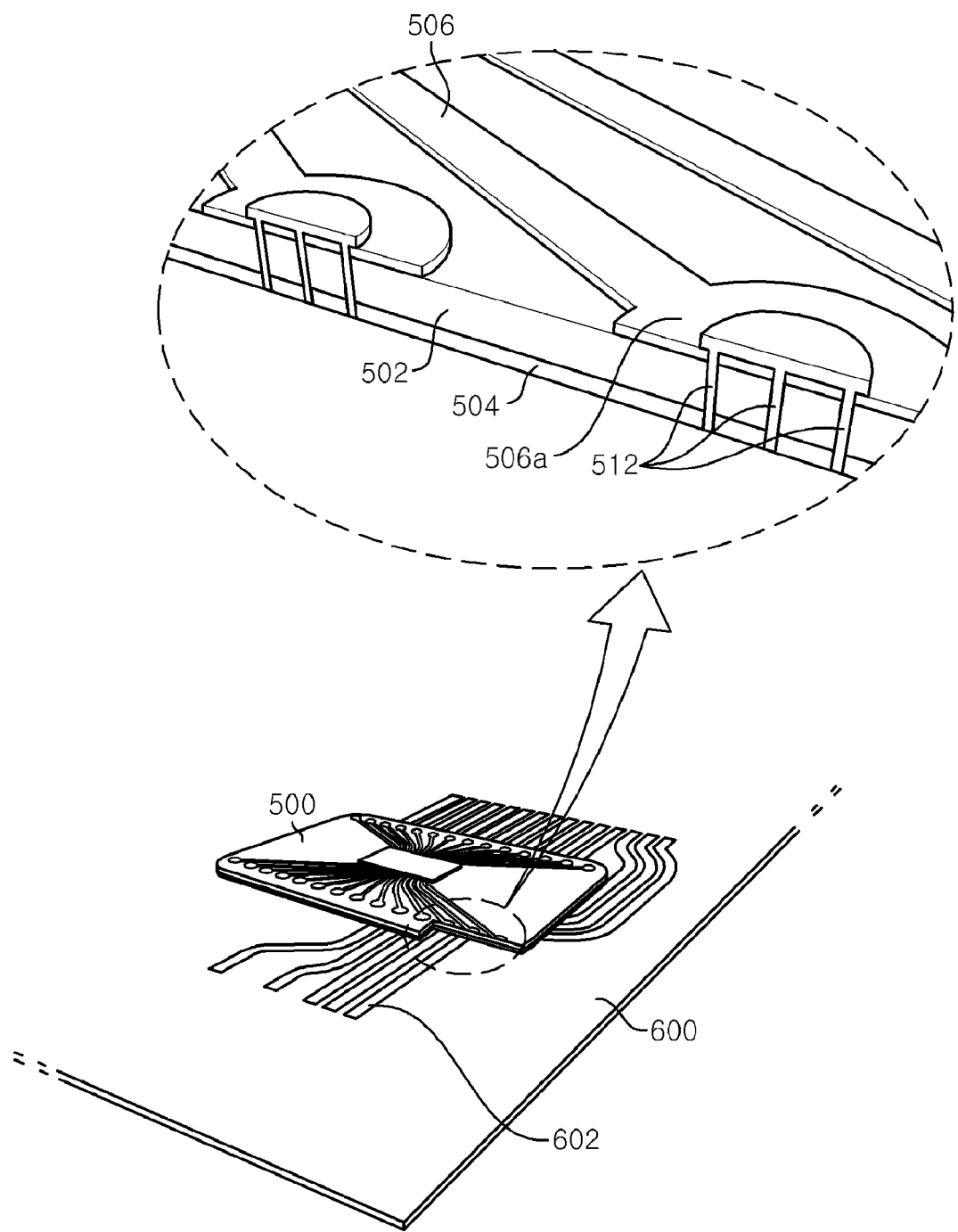
FIG. 6 is an enlarged sectional view showing a detailed structure of via-hole-type coupling grooves of the textile-type electronic component package in accordance with another embodiment of the present invention.

FIG. 5 shows a structure of a textile-type electronic component package in accordance with another embodiment of the present invention, and FIG. 6 is an enlarged sectional view showing a detailed structure of via-hole-type coupling parts of the textile-type electronic component package in accordance with another embodiment of the present invention.

Referring to FIGS. 5 and 6, a textile-type electronic component package 500 in accordance with another embodiment of the present invention is substantially identical to the textile-type electronic component package 100 of the first embodiment, except that no mounting pads are formed.

That is, reference numerals 502, 504, 506, 506a, 508, and 512 correspond to the elements 102, 104, 106, 106a, 108, and 112 of FIG. 1, respectively. In FIG. 6, reference numerals 600 and 602 are a textile and conductive circuit patterns, respectively.

In addition, like the via-hole-type coupling parts 112 in the first embodiment, the via-hole-type coupling parts 512 in the second embodiment are provided with not a single via-hole but a plurality of via-holes or bunch of fine holes. The via-hole-type coupling parts 512 electrically couple the conductive patterns 506 of the textile-type electronic component package 500 and the conductive circuit patterns 602 of the textile 600.

In this embodiment, however, no mounting pads are formed on the thermoplastic adhesive 504. Due to such a structural difference, the process of mounting or attaching the textile-type electronic component package on the textile or clothes becomes different. This difference will be described in detail with reference the manufacturing processes of FIGS. 7A to 7E.

FIGS. 7A to 7E show a procedure of manufacturing a textile-type electronic component package and attaching the manufactured textile-type electronic component package to a textile in accordance with the second embodiment of the present invention.

Figure 7A:
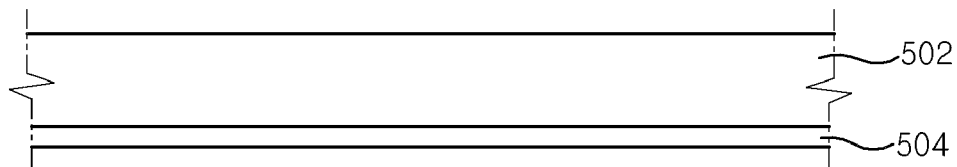
FIGS. 7A to 7E show a procedure of manufacturing a textile-type electronic component package and attaching the manufactured textile-type electronic component package to a textile, in accordance with another embodiment of the present invention.
Figure 7B:
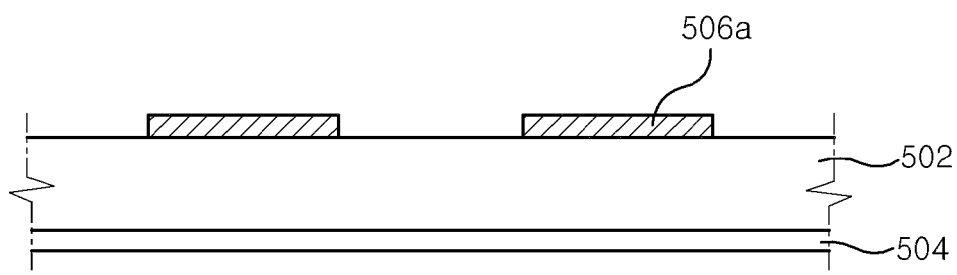

As illustrated in FIGS. 7A and 7B, like in FIGS. 4A and 4B of the above-described first embodiment, a thermoplastic adhesive 504 is coated on the bottom surface of a textile base 502, and a plurality of conductive patterns 506 each having an end contact point 506a are formed on the top surface of the textile base 502.

Figure 7C:
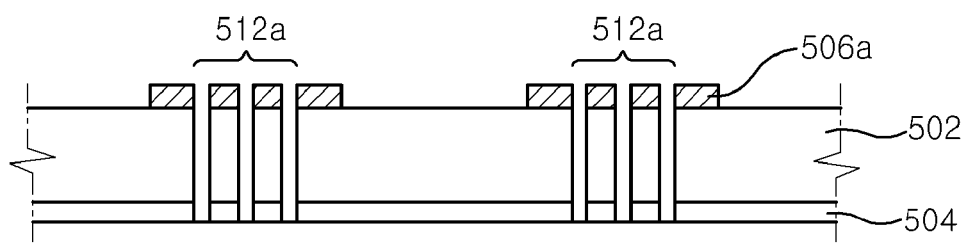

Next, as illustrated in FIG. 7C, like in the first embodiment, a drilling process using a fine laser drill is performed to sequentially drill the end contact points 506a of the conductive patterns 506, the textile base 502, and the thermoplastic adhesive 504 to thereby define via-holes 512a completely penetrating from the end contact points 506a to the thermoplastic adhesive 504. The via-holes 512a may be defined with not a single via-hole but a plurality of via-holes or a bunch of fine holes in order to sufficiently maintain rigidity in spite of the physical structural variations such as stretching and bending which may occur during the use of the textile-type electronic component package 500.

Thereafter, the textile-type electronic component 508 or an electronic component is mounted at a target position on the conductive patterns 506 to thereby complete the textile-type electronic component package 500.

Figure 7D:
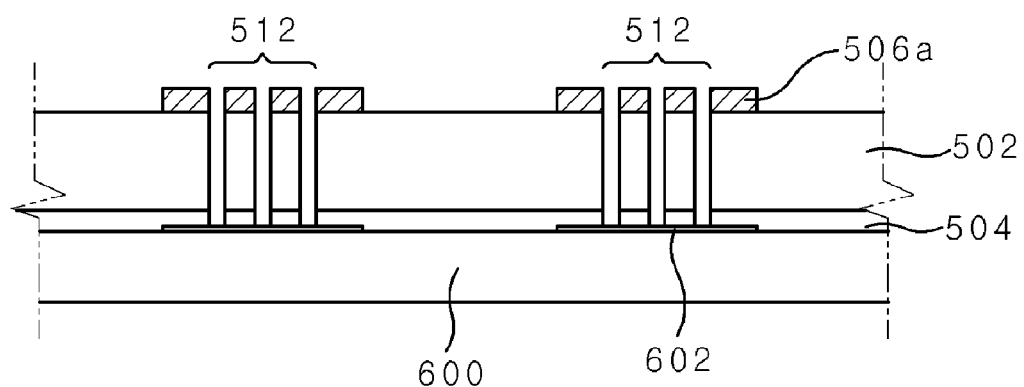

The textile-type electronic component package 500 in which the via-holes 512a are formed is aligned at a target position of the textile or clothes 600 having conductive circuit patterns 602. That is, the via-holes 512a of the textile-type electronic component package 500 is contacted and aligned on the corresponding conductive circuit patterns 602 formed on the textile 600. For example, using a thermocompressor (for example, a laser welding device, an iron, a soldering iron, or an ultrasonic welding device), heat is applied to the region where the textile-type electronic component package 500 and the textile 600 are contacted with each other. As a result, as illustrated in FIG. 7D, the textile-type electronic component package 500 is temporarily attached or pre-attached to the textile 600.

The textile-type electronic component package 500 is temporarily attached to the textile 600 in order to prevent the misalignment between the textile-type electronic component package 500 and the textile 600 during a subsequent process of filling the via-hole-type coupling groove regions 512a with a conductive polymer.

Figure 7E:
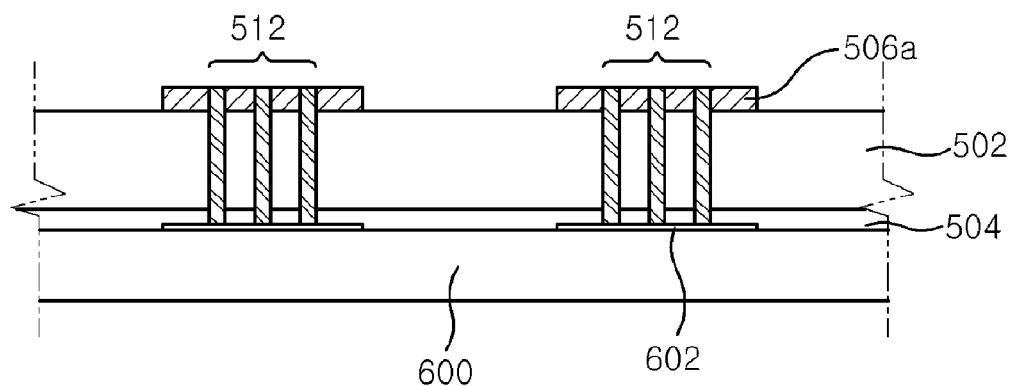

The via-holes 512a are selectively supplied with a predetermined amount of a conductive polymer material by using a fixed quantity supply system such as a dispenser, thereby filling the insides of the via-holes 512a. Using a thermocompressor (for example, a laser welding device, an iron, a soldering iron, or an ultrasonic welding device), heat is applied to the region where the textile-type electronic component package 500 and the textile 600 are contacted with each other. As a result, as illustrated in FIG. 7E, the conductive polymer is sintered and simultaneously the textile-type electronic component package 500 is attached to the textile 600. The conductive polymer is a conductive ink or a conductive adhesive which exhibits conductivity only when it is sintered by a predetermined amount of heat. Heat is radiated in a direction toward the rear surface of the textile 600 or the surface on which the textile-type electronic component package 500 is mounted.

As described above, in accordance with the embodiment of the present invention, the electrodes of the textile-type electronic component package and the conductive circuit patterns of the textile are mutually coupled together and simultaneously the thermoplastic adhesive of the textile-type electronic component package and the textile are attached together at a time through the sintering process using the thermocompressor. Therefore, a relatively weak adhesive strength of the conductive polymer (the conductive adhesive) is strongly complemented by the thermoplastic adhesive disposed therearound, thereby increasing an overall adhesive strength. Hence, even though the textile is deformed by stretching or bending, the excellent rigidity and textile adhesive strength as well as the flexibility can be maintained.

In implementing the textile-type or cloth-type computing system, the existing electronic component or the textile-based electronic component is configured in a textile-type package and thus has a form suitable for the textile-based or cloth-based electronic circuit.

Furthermore, the textile-type electronic component package and the mounting method thereof in accordance with the embodiments of the present invention have no great difference in manufacture from the existing electronic circuit configuring method which attaches the electronic circuit by soldering components. Hence, the textile-type electronic component package has a structure which can be easily accepted by the existing electronic component and package manufactures. Also, in manufacturing the electronic clothing products, the methods in accordance with the embodiments of the present invention have no great difference from the existing mounting method which attaches a pattern or letter to the clothes by thermocompression. Hence, it is possible to ensure the generality in application and improve the productivity through the simplification of processes.

Moreover, the conventional attaching method using needlework or sewing has a limit on attaching the fine patterns due to its nature. In particular, in the case of ready-made clothes in which the interior lining and the exterior lining have been already made, it is difficult to stitch only one lining. Therefore, the manufacturer must mount the textile-type electronic component package by a manual labor such as stitching. However, in accordance with the embodiments of the present invention, the textile-type electronic component package can be attached to the textile or clothes by an attaching method using thermocompression. Consequently, the textile-type electronic component package can be easily attached at any position of the ready-made clothes or the textile.

While the invention has been shown and described with respect to the preferred embodiments, it will be understood by those skilled in the art that various changes and modifications may be made without departing from the scope of the invention as defined in the following claims.

What is claimed is:

1. A method for manufacturing and mounting a textile electronic component package, the method comprising:
   coating a thermoplastic adhesive on the bottom surface of a textile base;
   forming a textile electronic component and a plurality of conductive patterns having end contact points on the top surface of the textile base;
   sequentially drilling portions of the end contact points, the textile base, and the thermoplastic adhesive to form a plurality of via-holes;
   aligning the textile base, in which the plurality of via-holes are formed, at a target position of a textile having conductive circuit pattern;
   filling the plurality of via-holes with a conductive polymer; and
   applying heat to a region where the textile base and the conductive circuit patterns are contacted together to sinter the conductive polymer and attach the textile base to the textile.

2. The method of claim 1, wherein the via-holes are filled with the conductive polymer to form via-hole-type coupling parts to electrically couple the conductive patterns and the conductive circuit pattern of the textile.

3. The method of claim 1, further comprising pre-attaching the textile base to the textile by applying heat to the region where the textile base and the textile are contacted together, before the plurality of via-holes are filled with the conductive polymer.

4. The method of claim 3, wherein the heat is generated using a thermocompressor which is one of a laser welding device, an iron, a soldering iron, and an ultrasonic welding device.

\* \* \* \* \*